United States Patent
Han et al.

(10) Patent No.: US 7,747,914 B2
(45) Date of Patent: Jun. 29, 2010

(54) MEMORY DIAGNOSIS TEST CIRCUIT AND TEST METHOD USING THE SAME

(75) Inventors: Yong-woon Han, Suwon-si (KR); Ki-am Lee, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 422 days.

(21) Appl. No.: 11/980,442

(22) Filed: Oct. 31, 2007

(65) Prior Publication Data
US 2008/0062789 A1 Mar. 13, 2008

(30) Foreign Application Priority Data
Jan. 8, 2007 (KR) .................. 10-2007-0002176

(51) Int. Cl.
*G11C 29/00* (2006.01)
(52) U.S. Cl. ...................... 714/718; 365/201
(58) Field of Classification Search ............ 365/189.14, 365/200, 203, 222, 201; 714/718
See application file for complete search history.

(56) References Cited

U.S. PATENT DOCUMENTS

| | | | | |
|---|---|---|---|---|
| 6,381,190 B1 * | 4/2002 | Shinkai | .................. | 365/189.14 |
| 6,445,627 B1 * | 9/2002 | Nakahara et al. | ............ | 365/200 |
| 6,496,431 B1 * | 12/2002 | Nakahara et al. | ............ | 365/200 |
| 6,512,709 B1 * | 1/2003 | Nakahara et al. | ............ | 365/200 |
| 6,819,610 B2 * | 11/2004 | Miyo et al. | .................. | 365/203 |
| 6,894,942 B2 * | 5/2005 | Cho | .......................... | 365/222 |

FOREIGN PATENT DOCUMENTS

| | | |
|---|---|---|
| JP | 05-026960 | 2/1993 |
| JP | 05-128896 | 5/1993 |
| JP | 05-164821 | 6/1993 |
| JP | 06-163659 | 6/1994 |
| KR | 10-100132400 | 12/1997 |
| KR | 10-2000-004712 | 1/2000 |

OTHER PUBLICATIONS

Office Action dated Dec. 17, 2008 for corresponding Korean Application No. 2007-0002176.

* cited by examiner

*Primary Examiner*—David Ton
(74) *Attorney, Agent, or Firm*—Harness, Dickey & Pierce, P.L.C.

(57) ABSTRACT

According to an example embodiment, a memory diagnosis test circuit may include a memory core block, a word line selector, a bit line selector, and/or an analog mode control unit. The memory core block may include a plurality of memory cells. The word line selector may be configured to select one of a plurality of word lines of the memory core block using a first shift register. The bit line selector may be configured to select one of a plurality of bit line pairs of the memory core block using a second shift register. The analog mode control unit may be configured to monitor data corresponding to the selected word line and bit line pair.

21 Claims, 3 Drawing Sheets

MEMORY DIAGNOSIS TEST CIRCUIT AND TEST METHOD USING THE SAME

PRIORITY STATEMENT

This application claims priority under 35 U.S.C. §119 to Korean Patent Application No. 10-2007-0002176, filed on Jan. 8, 2007, in the Korean Intellectual Property Office, the entire contents of which are incorporated herein by reference.

BACKGROUND

1. Field

Example embodiments are directed to semiconductor integrated circuits, for example, memory diagnosis test circuits for analyzing errors in static random access memory device (SRAM) cells and test methods using the same.

2. Description of Related Art

A large scale integrated circuit (LSI) may include a plurality of circuit blocks, for example, read only memory devices (ROMs), random access memory devices (RAMs), input/output circuits, etc., as well as a central processing unit (CPU). The ROMs of the system LSI may store a program processed by the CPU or fixed data. The RAMs, for example, SRAMs, may temporally store data processed by the CPU relatively quickly. SRAMs of the system LSI may have small capacities, for example, 128K.

As the capacities of the SRAMs increase, the possibility of error occurrence may increase in the circuit blocks during manufacturing. To analyze an error of the circuit blocks, a method of inserting a test element group (TEG) pattern, which may be approximately the same as the circuit blocks, into a scribe line region of a wafer may be used. Consequently, semiconductor yield may be improved by analyzing the error of the circuit blocks while maintaining an existing net die.

FIG. 1 is a block diagram illustrating a conventional SRAM TEG pattern 100.

Referring to FIG. 1, the SRAM TEG pattern 100 may include an SRAM core block 110, a control unit 120, a row decoder 130, a column decoder 140, and/or a sense amplifier unit 150.

The SRAM core block 110 may include a plurality of rows and columns of unit SRAM cells, each including six cell transistors, for example. The control unit 120 may generate control signals in order to control the SRAM core block 110. The row decoder 130 may decode a plurality of row address signals and selectively enable a plurality of word lines of the SRAM core block 110. The column decoder 140 may decode a plurality of column address signals and selectively enable a plurality of bit lines of the SRAM core block 110. The sense amplifier unit 150 may sense-amplify data stored in a plurality of cells disposed at positions where the enabled word lines and the enabled bit lines cross each other.

If an error occurs, the above SRAM TEG pattern 100 may not be able to detect which type of error is in the cell transistors of the SRAM core block 110. For example, if a single bit error occurs in an SRAM and the error is a transistor error or a contact error, the exact position of the error may not be able to be found by the conventional SRAM TEG pattern 100. Thus, it may be unclear in which node of the six transistors connected to each other the error has occurred.

SUMMARY

According to an example embodiment, a memory diagnosis test circuit may include a memory core block, a word line selector, a bit line selector, and/or an analog mode control unit. The memory core block may include a plurality of memory cells. The word line selector may be configured to select one of a plurality of word lines of the memory core block using a first shift register. The bit line selector may be configured to select one of a plurality of bit line pairs of the memory core block using a second shift register. The analog mode control unit may be configured to monitor data corresponding to the selected word line and bit line pair.

The first shift register may select one of the plurality of word lines of the memory core block corresponding to one bit of a first input data signal sequentially input in response to a first clock signal. The second shift register may select one of the plurality of bit line pairs of the memory core block corresponding to one bit of a second input data signal sequentially input in response to a second clock signal. The analog mode control unit may transfer data of the selected bit line pair to one of a plurality of data line pairs in response to an analog mode signal.

Alternatively, the memory diagnosis test circuit may further include a sense amplifier unit connected to the plurality of bit line pairs. The first shift register may sequentially store a first input data signal in response to a first clock signal and select one of the plurality of word lines of the memory core block in response to the first input data signal. The second shift register may sequentially store a second input data signal in response to a second clock signal. A selection unit included in the bit line selector may select one of the plurality of bit line pairs of the memory core block in response to the second input data signal. The sense amplifier unit may sense-amplify data of the selected bit line pair and output the data as an output data signal. The analog mode control unit transfers the data of the selected bit line pair to one of a plurality of data line pairs in response to an analog mode signal.

According to another example embodiment, a memory diagnosis test method may include sequentially storing a first input data signal in a first shift register in response to a first clock signal and selecting one of a plurality of word lines of a memory core block in response to the first input data signal. A second input data signal may be sequentially stored in a second shift register in response to a second clock signal. One of a plurality of bit line pairs of the memory core block may be selected in response to the second input data signal. Data of the selected bit line pair may be sense-amplified and output as an output data signal. The data of the selected bit line pair may be transferred to one of a plurality of data line pairs in response to an analog mode signal.

Accordingly, an SRAM TEG pattern may be employed to determine in which node included in a unit SRAM cell an error occurs, and may be more easily inserted into a scribe line by including a small number of pads.

BRIEF DESCRIPTION OF THE DRAWINGS

The above and other features and advantages of example embodiments will become more apparent by describing in detail example embodiments with reference to the attached drawings. The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
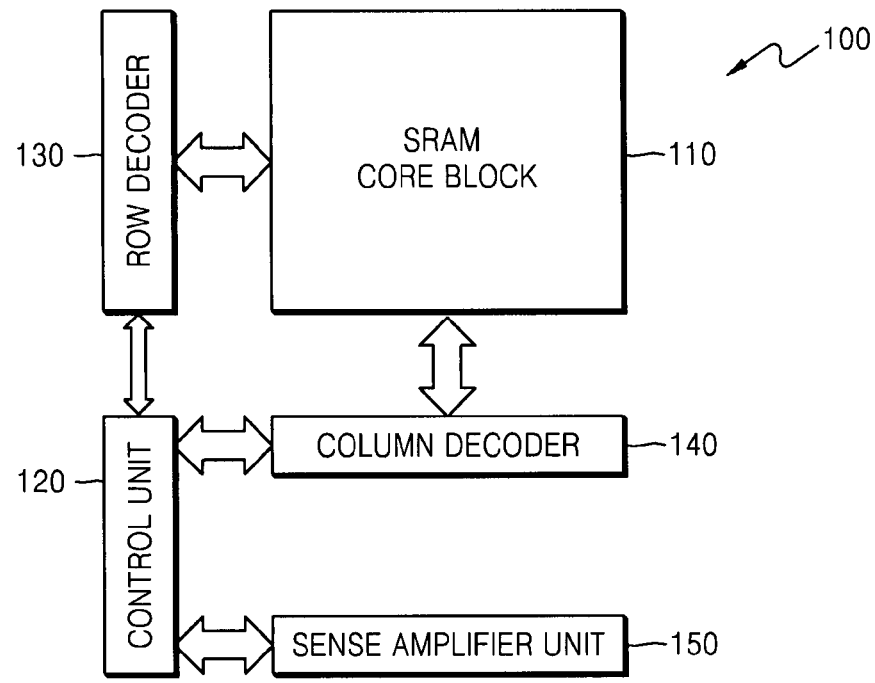
FIG. 1 is a block diagram of a conventional static random access memory device (SRAM) test element group (TEG) pattern.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
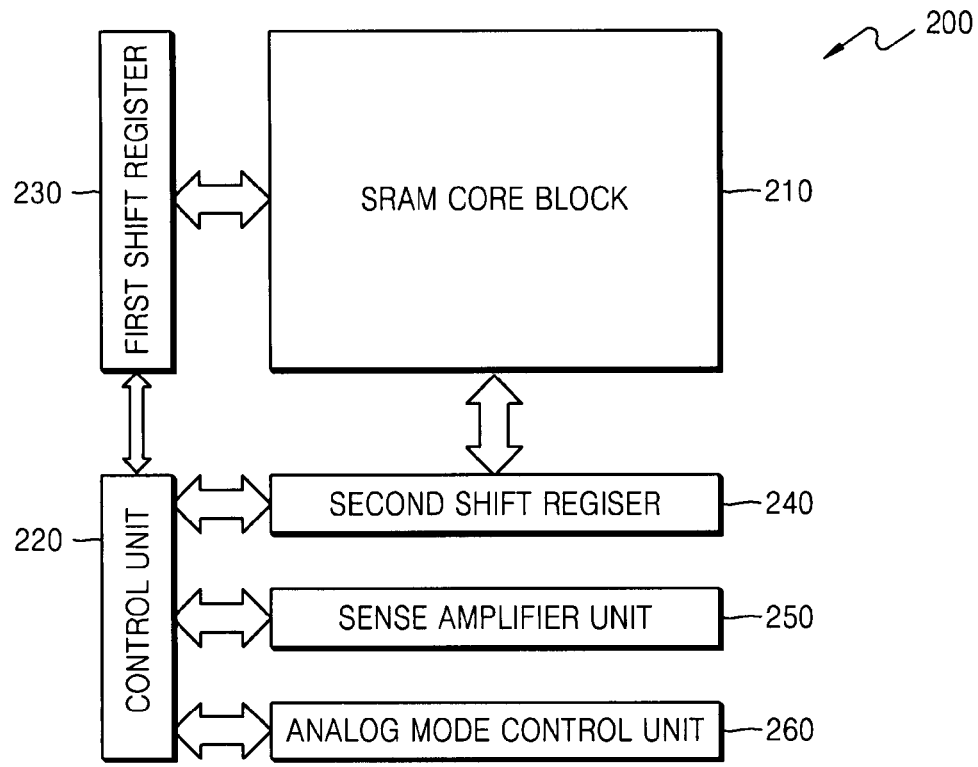
FIG. 2 is a block diagram of an SRAM TEG pattern according to an example embodiment.

FIG. 2 is a block diagram illustrating a static random access memory device (SRAM) test element group (TEG) 200 according to an example embodiment.

Referring to FIG. 2, the SRAM TEG pattern 200 may include an SRAM core block 210, a control unit 220, a first shift register 230, a second shift register 240, a sense amplifier unit 250, and/or an analog mode control unit 260.

The SRAM core block 210 may include a plurality of rows and columns of unit SRAM cells, each including six cell transistors, for example. The control unit 220 may generate control signals in order to control the SRAM core block 210. The first shift register 230 may selectively enable word lines of the SRAM core block 210. The first shift register 230 may be part of a word line selector, for example. The second shift register 240 may selectively enable bit lines of the SRAM core block 210. The second shift register 240 may be part of a bit line selector, for example. The sense amplifier unit 250 may sense-amplify cell data transferred to the selected bit lines. The analog mode control unit 260 may directly monitor the SRAM cells of the SRAM core block 210.

Figure 3:
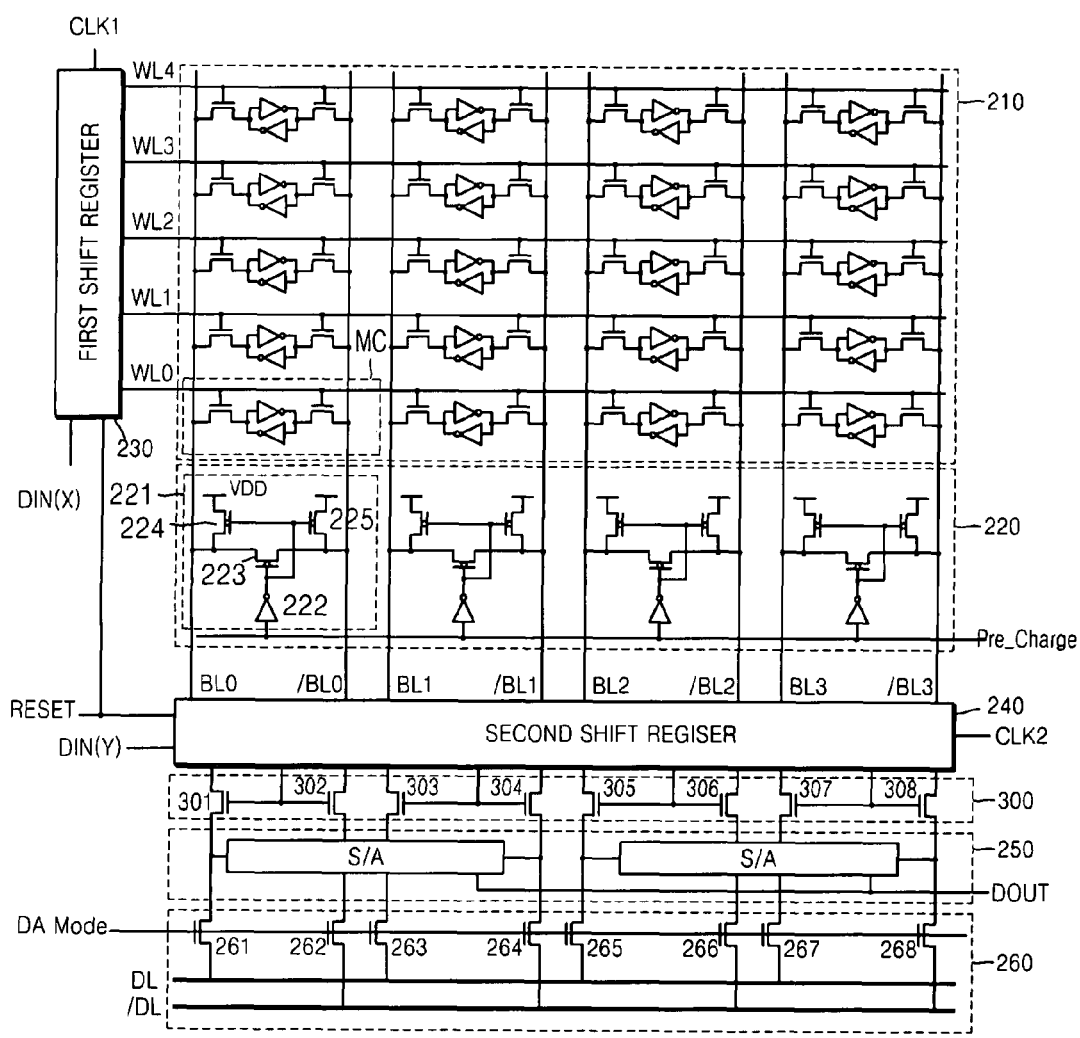
FIG. 3 is a circuit diagram of the SRAM TEG pattern of FIG. 2.

FIG. 3 is a circuit diagram illustrating the SRAM TEG pattern of FIG. 2 in more detail, according to an example embodiment.

Referring to FIG. 3, the SRAM core block 210 may include a plurality of SRAM cells MC disposed at positions where first through fifth word lines WL0 through WL4 and first through fourth bit line pairs BL0 and /BL0 through BL3 and /BL3 cross each other.

The control unit 220 may include a plurality of equalization units which may respectively precharge the first through fourth bit line pairs BL0 and /BL0 through BL3 and /BL3 to a source voltage level VDD in response to a precharge signal Pre_Charge. A first equalization unit 221 may include an inverter 222 and first through third metal-oxide semiconductor (MOS) transistors 223-225, illustrated in FIG. 3 for exemplary purposes as p-channel MOS (PMOS) transistors. The inverter 222 may input the precharge signal Pre_Charge. The first PMOS transistor 223 may be connected between a first bit line BL0 and a first complementary bit line /BL0, where the gate of the first PMOS transistor 223 may be connected to the output of the inverter 222. The second PMOS transistor 224 may be connected between the source voltage VDD and the first bit line BL0, where the gate of the second PMOS transistor 224 may also be connected to the output of the inverter 222. The third PMOS transistor 225 may be connected between the source voltage VDD and the first complementary bit line /BL0, where the gate of the third PMOS transistor 225 may also be connected to the output of the inverter 222.

The first shift register 230 may input a first input data signal DIN(X) bit by bit in response to a first clock signal CLK1, and may enable one of the first through fifth word lines WL0 through WL4 corresponding to the first input data signal DIN(X). For example, if the first input data signal DIN(X) is input as 0-0-0-0-1, the first word line WL0 may be enabled.

The second shift register 240 may input a second input data signal DIN(Y) bit by bit in response to a second clock signal CLK2, and may enable one of the first through fourth bit line pairs BL0 and /BL0 through BL3 and /BL3 corresponding to the second input data signal DIN(Y). For example, if the second input data signal DIN(Y) is input as 0-0-0-1, a first selection transistor pair 301 and 302 of a selection unit 300, corresponding to the first bit line pair BL0 and /BL0, may be turned on. The first and second shift registers 230 and 240 may be reset by a reset signal RESET.

The selection unit 300 may include a plurality of first through fourth selection transistor pairs 301 and 302 through 307 and 308, respectively corresponding to the first through fourth bit line pairs BL0 and /BL0 through BL3 and /BL3. One of the first through fourth selection transistor pairs 301 and 302 through 307 and 308 may be turned on in response to the second input data signal DIN(Y).

The sense amplifier unit 250 may sense-amplify data of one of the first through fourth bit line pairs BL0 and /BL0 through BL3 and /BL3 transferred through the selection unit 300, and may output the data as an output data signal DOUT.

The analog mode control unit 260 may transfer data of the selected bit line pair, from among the first through fourth bit line pairs BL0 and /BL0 through BL3 and /BL3, transferred through the selection unit 300, to a data line pair DL and /DL in response to an analog mode signal DA Mode. The analog mode signal DA Mode may monitor each cell of the SRAM cells of the SRAM core block 210 in accordance with a user criteria.

The analog mode control unit 260 may include first through fourth transfer transistor pairs 261 and 262 through 267 and 268, respectively connected to the first through fourth selection transistor pairs 301 and 302 through 307 and 308. The first through fourth transfer transistor pairs 261 and 262 through 267 and 268 may be turned on in response to the analog mode signal DA Mode. The analog mode control unit 260 may determine in which node of the six transistors included in an SRAM cell an error has occurred by analyzing the data transferred to the data line pair DL and /DL through the turned-on first through fourth transfer transistor pairs 261 and 262 through 267 and 268.

Figure 4:
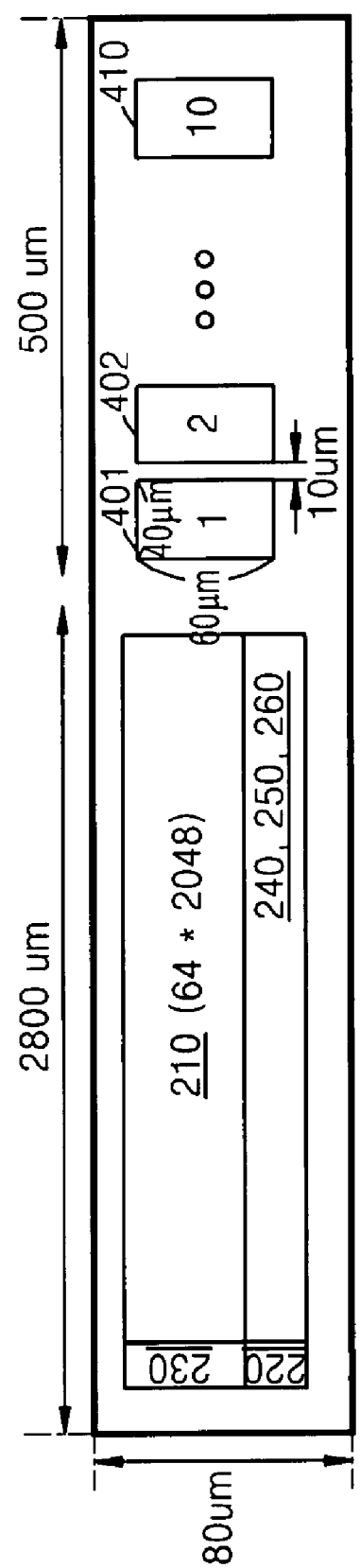
FIG. 4 is a diagram of the architecture of the SRAM TEG pattern of FIG. 2 disposed in an example scribe line region of a wafer, according to an example embodiment.

FIG. 4 is a diagram illustrating an example architecture of the SRAM TEG pattern 200 shown in FIG. 2 disposed in a scribe line region of a wafer, according to an example embodiment.

Referring to FIG. 4, the SRAM TEG pattern 200 and a plurality of pads 401 through 410 connected to the SRAM TEG pattern 200 may be disposed on the scribe line region. For illustrative purposes, the scribe line region is shown as a region having a width of 80 um and a length of 3300 um, for example, and between a plurality of main chips of the wafer. The pads 401 through 410 may include a source voltage VDD pad, a ground voltage VSS pad, a data input/output pad DQ, first and second analog pads, first and second clock pads, a DA Mode reception pad, a precharge pad, and/or a reset pad. For example, the data input/output pad DQ may be connected to first and second input data signals and the output data signal DOUT. The first analog pad may be connected to a data line DL and the second analog pad may be connected to a complementary data line /DL. The DA Mode reception pad may be connected to the analog mode signal DA Mode. The first clock pad may be connected to the first clock signal CLK1 and the second clock pad may be connected to the second clock signal CLK2. The precharge pad may be connected to the precharge signal Pre_Charge. The reset pad may be connected to the reset signal RESET. As described above, ten pads may be used to test the SRAM TEG pattern 200.

In comparison with the conventional SRAM TEG pattern 100 including the row decoder 130 and the column decoder 140 described above with reference to FIG. 1, the SRAM TEG pattern 200 according to an example embodiment may include fewer pads. For example, if the memory capacity of the SRAM core block 110 of FIG. 1 is 64*2048 units, the SRAM TEG pattern 100 may need seventeen address signal pads in order to address the SRAM core block 110. In contrast, the SRAM TEG pattern 200 may need only four pads, for example, a reset pad, a first clock pad, a second clock pad and/or a data input/output pad DQ, in order to address the SRAM core block 210. Accordingly, the SRAM TEG pattern 200 may be more easily inserted into the scribe line region by including a smaller number of pads.

As described above, SRAM TEG patterns according to example embodiments may be employed to determine in which node in a unit SRAM cell an error occurs, and may be relatively easily inserted into a scribe line by including a smaller number of pads.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory diagnosis test circuit, comprising:
a memory core block including a plurality of memory cells;
a word line selector configured to select one of a plurality of word lines of the memory core block using a first shift register;
a bit line selector configured to select one of a plurality of bit line pairs of the memory core block using a second shift register; and
an analog mode control unit configured to monitor data corresponding to the selected word line and bit line pair.

2. The memory diagnosis test circuit of claim 1, wherein the first shift register selects one of the plurality of word lines of the memory core block corresponding to one bit of a first input data signal sequentially input in response to a first clock signal,
the second shift register selects one of the plurality of bit line pairs of the memory core block corresponding to one bit of a second input data signal sequentially input in response to a second clock signal, and
the analog mode control unit transfers data of the selected bit line pair to one of a plurality of data line pairs in response to an analog mode signal.

3. The memory diagnosis test circuit of claim 2, wherein a plurality of static random access memory device (SRAM) cells of the memory core block are disposed at the intersection of the word lines and the bit line pairs.

4. The memory diagnosis test circuit of claim 2, wherein the analog mode control unit includes a plurality of n-channel metal-oxide semiconductor (NMOS) transistors connected between the bit line pairs and the data line pairs, and having gates connected to the analog mode signal.

5. The memory diagnosis test circuit of claim 2, wherein the first and second shift registers are reset by a reset signal.

6. The memory diagnosis test circuit of claim 5, further comprising:
a plurality of pads respectively connected to the first clock signal, the second clock signal, the first input data signal, the second input data signal, the analog mode signal, the data line pairs, and the reset signal.

7. The memory diagnosis test circuit of claim 2, wherein the memory diagnosis test circuit is disposed in a scribe line between main chips of a semiconductor wafer.

8. The memory diagnosis test circuit of claim 1, further comprising:
a sense amplifier unit connected to the plurality of bit line pairs, wherein
the first shift register sequentially stores a first input data signal in response to a first clock signal and selects one of the plurality of word lines of the memory core block in response to the first input data signal,
the second shift register sequentially stores a second input data signal in response to a second clock signal, and a selection unit included in the bit line selector selects one of the plurality of bit line pairs of the memory core block in response to the second input data signal, the sense amplifier unit sense-amplifies data of the selected bit line pair and outputs the data as an output data signal, and the analog mode control unit transfers the data of the selected bit line pair to one of a plurality of data line pairs in response to an analog mode signal.

9. The memory diagnosis test circuit of claim 8, wherein a plurality of static random access memory device (SRAM) cells of the memory core block are disposed at the intersection of the word lines and the bit line pairs.

10. The memory diagnosis test circuit of claim 8, further comprising:
an equalization unit configured to precharge the bit line pairs to a source voltage level in response to a precharge signal.

11. The memory diagnosis test circuit of claim 10, further comprising:
a plurality of pads respectively connected to the first clock signal, the second clock signal, the output data signal, the analog mode signal, the data line pair, the precharge signal, and the reset signal, a source voltage pad, and a ground voltage pad.

12. The memory diagnosis test circuit of claim 11, wherein the first and second input data signals are further connected to the pad which is connected to the output data signal.

13. The memory diagnosis test circuit of claim 8, wherein the first and second shift registers are reset by a reset signal.

14. The memory diagnosis test circuit of claim 13, further comprising:
a plurality of pads respectively connected to the first clock signal, the second clock signal, the output data signal, the analog mode signal, the data line pair, the precharge signal, and the reset signal, a source voltage pad, and a ground voltage pad.

15. The memory diagnosis test circuit of claim 14, wherein the first and second input data signals are further connected to the pad which is connected to the output data signal.

16. The memory diagnosis test circuit of claim 8, wherein the selection unit includes a plurality of selection transistor pairs having gates respectively connected to a plurality of output nodes of the second shift register and one end respectively connected to the bit line pairs.

17. The memory diagnosis test circuit of claim 16, wherein the analog mode control unit includes a plurality of n-channel metal-oxide semiconductor (NMOS) transistors which are respectively connected between the other end of the selection transistor pairs and the data line pair, and having gates connected to the analog mode signal.

18. The memory diagnosis test circuit of claim 8, wherein the memory diagnosis test circuit is disposed in a scribe line between main chips of a semiconductor wafer.

19. A memory diagnosis test method, comprising:
sequentially storing a first input data signal in a first shift register in response to a first clock signal and selecting one of a plurality of word lines of a memory core block in response to the first input data signal;
sequentially storing a second input data signal in a second shift register in response to a second clock signal;
selecting one of a plurality of bit line pairs of the memory core block in response to the second input data signal;
sense-amplifying data of the selected bit line pair and outputting the data as an output data signal; and
transferring the data of the selected bit line pair to one of a plurality of data line pairs in response to an analog mode signal.

20. The method of claim 19, further comprising:
resetting the first and second shift registers.

21. The method of claim 19, further comprising:
precharging the bit line pairs to a source voltage level in response to a precharge signal.

* * * * *